(12) United States Patent
Baek et al.

(10) Patent No.: US 9,570,400 B2
(45) Date of Patent: Feb. 14, 2017

(54) SEMICONDUCTOR PACKAGE (71) Applicant: SAMSUNG ELECTRONICS CO., LTD., Suwon-si, Gyeonggi-do (KR)

(72) Inventors: Bo-Na Baek, Yongin-si (KR);
Seok-Won Lee, Seongnam-si (KR);
Eun-Seok Cho, Suwon-si (KR);
Dong-Han Kim, Osan-si (KR);
Kyoung-Sei Choi, Yongin-si (KR);
Sa-Yoon Kang, Seoul (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 33 days.

(21) Appl. No.: 14/573,134

(22) Filed: Dec. 17, 2014

(65) Prior Publication Data
US 2015/0318226 A1 Nov. 5, 2015

(30) Foreign Application Priority Data
May 2, 2014 (KR) .................. 10-2014-0053253

(51) Int. Cl.
*H01L 23/373* (2006.01)
*H01L 23/538* (2006.01)
(Continued)

(52) U.S. Cl.
CPC .......... *H01L 23/5389* (2013.01); *H01L 23/14* (2013.01); *H01L 23/49816* (2013.01); *H01L 23/49822* (2013.01); *H01L 23/49827* (2013.01); *H01L 23/5226* (2013.01); *H01L 23/562* (2013.01); *H01L 24/19* (2013.01); *H01L 24/20* (2013.01); *H01L 25/105* (2013.01); *H01L 2224/04042* (2013.01); *H01L 2224/04105* (2013.01); *H01L 2224/12105* (2013.01); *H01L 2224/18* (2013.01); *H01L 2224/32245* (2013.01); *H01L 2224/48091* (2013.01); *H01L 2224/48227* (2013.01); *H01L 2224/48235* (2013.01); *H01L 2224/73253* (2013.01); *H01L 2224/73267* (2013.01); *H01L 2225/1035* (2013.01); *H01L 2225/1041* (2013.01); *H01L 2225/1058* (2013.01); *H01L 2924/1431* (2013.01);
(Continued)

(58) Field of Classification Search
CPC . H01L 23/373; H01L 23/3735; H01L 23/3738
See application file for complete search history.

(56) References Cited

U.S. PATENT DOCUMENTS 4,888,247 A 12/1989 Zweben et al.
6,183,592 B1 2/2001 Sylvester
(Continued)

FOREIGN PATENT DOCUMENTS

JP 2012-109350 A 6/2012
JP 2012-156251 A 8/2012
(Continued)

*Primary Examiner* — Jae Lee
(74) *Attorney, Agent, or Firm* — Lee & Morse, P.C.

(57) ABSTRACT

Provided is semiconductor package, including a semiconductor chip; an upper structure over the semiconductor chip, the upper structure having a first thermal expansion coefficient; and a lower structure under the semiconductor chip, the lower structure having a second thermal expansion coefficient of less than or equal to the first thermal expansion coefficient.

16 Claims, 10 Drawing Sheets (51) Int. Cl.
*H01L 23/14* (2006.01)
*H01L 23/522* (2006.01)
*H01L 23/498* (2006.01)
*H01L 23/00* (2006.01)
*H01L 25/10* (2006.01)

(52) U.S. Cl.
CPC ............ *H01L 2924/1434* (2013.01); *H01L 2924/15311* (2013.01); *H01L 2924/181* (2013.01)

(56) References Cited

U.S. PATENT DOCUMENTS

| | | | |
|---|---|---|---|
| 6,423,570 B1 | 7/2002 | Ma et al. |
| 6,586,276 B2 | 7/2003 | Towle et al. |
| 6,680,529 B2 | 1/2004 | Chen et al. |
| 6,713,859 B1 | 3/2004 | Ma |
| 7,087,991 B2 | 8/2006 | Chen et al. |
| 7,242,092 B2 | 7/2007 | Hsu |
| 7,435,910 B2 | 10/2008 | Sakamoto et al. |
| 7,674,986 B2 | 3/2010 | Chang et al. |
| 7,732,712 B2 | 6/2010 | Yamano |
| 7,852,634 B2 | 12/2010 | Sakamoto et al. |
| 7,855,342 B2 | 12/2010 | Sakamoto et al. |
| 7,937,828 B2 | 5/2011 | Yamano |
| 7,999,387 B2 | 8/2011 | Sakamoto et al. |
| 8,093,704 B2 | 1/2012 | Palmer et al. |
| 8,120,040 B2 | 2/2012 | Asai et al. |
| 8,237,059 B2 | 8/2012 | Kanemaru et al. |
| 8,298,945 B2 | 10/2012 | Leung et al. |
| 8,367,480 B2 | 2/2013 | Pagaila |
| 8,415,809 B2 | 4/2013 | Kang |
| 8,450,844 B2 | 5/2013 | Shin et al. |
| 8,535,989 B2 | 9/2013 | Sankman et al. |
| 8,692,363 B2 | 4/2014 | Koizumi et al. |
| 2007/0210427 A1 | 9/2007 | Lytle et al. |
| 2011/0228464 A1 | 9/2011 | Guzek et al. |
| 2012/0187557 A1 | 7/2012 | Kyozuka et al. |
| 2013/0003319 A1 | 1/2013 | Malatkar et al. |
| 2013/0249101 A1* | 9/2013 | Lin ............ H01L 24/96 257/773 |
| 2013/0307163 A1* | 11/2013 | Inoue ............ H01L 23/28 257/777 |

FOREIGN PATENT DOCUMENTS

| | | |
|---|---|---|
| JP | 2012-238804 A | 12/2012 |
| JP | 2012-238805 A | 12/2012 |
| WO | WO 2013/101161 A1 | 7/2013 |

* cited by examiner

SEMICONDUCTOR PACKAGE

CROSS-REFERENCE TO RELATED APPLICATION

Korean Patent Application No. 10-2014-0053253, filed on May 2, 2014, in the Korean Intellectual Property Office, and entitled: "Semiconductor Package," is incorporated by reference herein in its entirety.

BACKGROUND

1. Field

Example embodiments relate to a semiconductor package. For example, example embodiments relate to a semiconductor package including a logic chip.

2. Description of the Related Art

An area of a board on which a semiconductor package may be mounted may be reduced, and a package-on-package (POP) may include sequentially stacked semiconductor packages. The POP may be manufactured by arranging a semiconductor chip in a package substrate, and patterning an insulating layer and a conductive layer.

SUMMARY

Embodiments may be realized by providing a semiconductor package, including a semiconductor chip; an upper structure over the semiconductor chip, the upper structure having a first thermal expansion coefficient; and a lower structure under the semiconductor chip, the lower structure having a second thermal expansion coefficient of less than or equal to the first thermal expansion coefficient.

The upper structure may include a die attach film on an upper surface of the semiconductor chip; a reinforcing plate attached to the die attach film; and an upper insulating layer on the reinforcing plate. The first thermal expansion coefficient may be an average of thermal expansion coefficients of the die attach film and the upper insulating layer.

The semiconductor chip may have a thickness of greater than or equal to a thickness of the die attach film.

The upper structure may further include an upper plug through the upper insulating layer.

The upper structure may further include an upper solder resist on the upper insulating layer and that partially exposes the upper plug, and the first thermal expansion coefficient may be an average of thermal expansion coefficients of the die attach film, the upper insulating layer, and the upper solder resist.

The lower structure may include a lower insulating layer under the semiconductor chip and the upper structure; and a conductive pattern in the lower insulating layer and electrically connected to the semiconductor chip. The second thermal expansion coefficient may be a thermal expansion coefficient of the lower insulating layer.

The lower structure may further include a lower solder resist on a lower surface of the lower insulating layer and that partially exposes the conductive pattern, and the second expansion coefficient may be an average of thermal expansion coefficients of the lower insulating layer and the lower solder resist.

The lower structure may further include a dummy core in the lower insulating layer and that surrounds the semiconductor chip.

The lower structure may further include a lower plug in the lower insulating layer adjacent to the upper structure and electrically connected to the conductive pattern.

The semiconductor chip may include a logic chip.

The semiconductor package may further include a memory package stacked on the upper structure.

Embodiments may be realized by providing a semiconductor package, including a semiconductor chip; a die attach film on an upper surface of the semiconductor chip; a reinforcing plate attached to the die attach film; an upper insulating layer on the reinforcing plate; a lower insulating layer under the semiconductor chip; and a conductive pattern in the lower insulating layer and electrically connected to the semiconductor chip, an average of thermal expansion coefficients of the die attach film and the upper insulating layer being greater than or equal to a thermal expansion coefficient of the lower insulating layer, and the reinforcing plate having a thickness greater than a thickness of the conductive pattern.

A difference between the average of the thermal expansion coefficients of the die attach film and the upper insulating layer, and the thermal expansion coefficient of the lower insulating layer may be greater than or equal to about 30 ppm.

The semiconductor package may further include a dummy core in the lower insulating layer and that surrounds the semiconductor chip.

The semiconductor package may further include a plug through the upper insulating layer, the dummy core, and the lower insulating layer and electrically connected to the conductive pattern.

Embodiments may be realized by providing a semiconductor package, including a semiconductor chip; an upper structure over the semiconductor chip, the upper structure having a first thermal expansion coefficient and including an upper insulating layer on an upper surface of the semiconductor chip, and an upper plug through the upper insulating layer; and a lower structure under the semiconductor chip, the lower structure having a second thermal expansion coefficient, a difference between the first thermal expansion coefficient and the second thermal expansion coefficient being greater than or equal to about 30 ppm.

The upper plug may include a main contact in the hole of the upper insulating layer; an upper contact extending from an upper end of the main contact and on an upper surface of the upper insulating layer; and a lower contact extending from a lower end of the main contact and on a lower surface of the upper insulating layer.

The upper structure may include a die attach film on an upper surface of the semiconductor chip; a reinforcing plate attached to the die attach film; and an upper solder resist on the upper insulating layer and that partially exposes the upper plug. The upper insulating layer may be on the reinforcing plate.

The lower structure may include a first lower insulating layer; a second lower insulating layer; a third lower insulating layer; a fourth lower insulating layer; and a lower solder resist on a lower surface of the lower insulating layer and that partially exposes the conductive pattern.

The first thermal expansion coefficient may be an average of thermal expansions of the upper solder resist, the upper insulating layer, and the die attach film; and the second thermal expansion coefficient may be an average of thermal expansions of the first lower insulating layer, the second lower insulating layer, the third lower insulating layer, the fourth lower insulating layer, and the lower solder resist.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure) is illustrated in a cross-sectional view, an electronic device may include a plurality of the device structures (e.g., memory cell structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
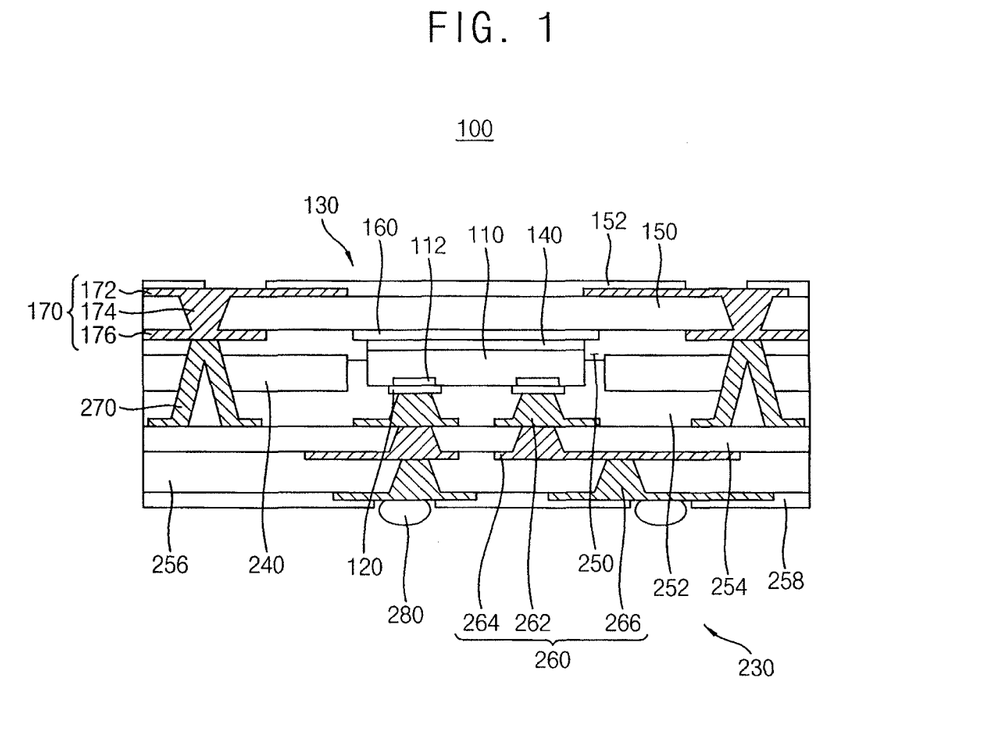
FIG. 1 illustrates a cross-sectional view of a semiconductor package in accordance with example embodiments.

FIG. 1 illustrates a cross-sectional view of a semiconductor package in accordance with example embodiments.

Referring to FIG. 1, a semiconductor package 100 of this example embodiment may include a semiconductor chip 110, an upper structure 130 and a lower structure 230.

The semiconductor chip 110 may be arranged at a central portion of the semiconductor package 100. The semiconductor chip 110 may have a thermal expansion coefficient lower than thermal expansion coefficients of the upper structure 130 and the lower structure 230. The semiconductor chip 110 may suppress warpage of the semiconductor package 100.

The semiconductor chip 110 may include bonding pads 112. In example embodiments, the bonding pads 112 may be arranged on a lower surface of the semiconductor chip 110. Conductive bumps 120 may be mounted on the bonding pads 112. The semiconductor chip 110 may include a logic chip, and a semiconductor package including a memory chip may be stacked on the semiconductor package 100. In example embodiments, the semiconductor chip 110 may include a memory chip.

The upper structure 130 may be arranged over the semiconductor chip 110. The upper structure 130 may have a first thermal expansion coefficient. In example embodiments, the upper structure 130 may include a die attach film 140, an upper insulating layer 150, an upper solder resist 152, a reinforcing plate 160 and an upper plug 170.

The die attach film 140 may be arranged on an upper surface of the semiconductor chip 110. The die attach film 140 may have a thermal expansion coefficient higher than the thermal expansion coefficient of the semiconductor chip 110. When the die attach film 140 has a thickness greater than a thickness of the semiconductor chip 110, the die attach film 140 may expand relatively as compared to the semiconductor chip 110, and the semiconductor chip 110 may not suppress warpage of the semiconductor package 100. In example embodiments, the thickness of the semiconductor chip 110 may be thicker than the thickness of the die attach film 140.

The reinforcing plate 160 may be attached to the upper surface of the semiconductor chip 110 using the die attach film 140. The reinforcing plate 160 may function as a heat-dissipating plate configured to dissipate heat in the semiconductor chip 110. Further, the reinforcing plate 160 may suppress warpage of the semiconductor package 100. The reinforcing plate 160 may be positioned over the semiconductor package 100, and the reinforcing plate 160 may suppress warpage of an upper portion of the semiconductor package 100. In example embodiments, the reinforcing plate 160 may include a conductive material such as a metal. For example, the reinforcing plate 160 may include copper.

The upper insulating layer 150 may be arranged on an upper surface of the reinforcing plate 160. The upper insulating layer 150 may have a hole vertically formed through the upper insulating layer 150. The upper insulating layer 150 may include an insulating material. The upper insulating layer 150 may not be restricted within a specific insulating material.

The upper plug 170 may include a main contact 172, an upper contact 174, and a lower contact 176. The main contact 172 may be formed in the hole of the upper insulating layer 150. The upper contact 174 may extend from an upper end of the main contact 172. The upper contact 174 may be arranged on an upper surface of the upper insulating layer 150. The lower contact 176 may extend from a lower end of the main contact 172. The lower contact 176 may be arranged on a lower surface of the upper insulating layer 150. In example embodiments, the lower contact 176 may be formed together with the reinforcing plate 160, and the lower contact 176 may have a lower surface substantially coplanar with a lower surface of the reinforcing plate 160. For example, the lower contact 176 may have a thickness substantially the same as a thickness of the reinforcing plate 160. The upper plug 170 may include copper.

In example embodiments, the upper plug 170 may not be electrically connected with the semiconductor chip 110. The upper plug 170 may be electrically connected with a semiconductor package stacked on the semiconductor package 100. When the semiconductor package is not stacked on the semiconductor package 100, the upper structure 130 may not include the upper plug 170.

The upper solder resist 152 may be arranged on the upper surface of the upper insulating layer 150 to expose the upper contact 174. Conductive bumps, which may be electrically connected between the semiconductor package 100 and the stacked semiconductor package, may be mounted on the upper contact 174 and exposed through the upper solder resist 152.

As mentioned above, the upper structure 130 may have the first thermal expansion coefficient. The first thermal expansion coefficient may be an average of the thermal expansion coefficients of the die attach film 140, the upper insulating layer 150, and the upper solder resist 152. Further, a thickness of a conductive portion in the upper structure 130 may be a sum of a thickness of the reinforcing plate 160, a thickness of the upper contact 174, and a thickness of the lower contact 176. The upper structure 130 may not include the upper plug 170, and the thickness of the conductive portion in the upper structure 130 may be the thickness of the reinforcing plate 160.

The lower structure 230 may be arranged under the semiconductor chip 110. The lower structure 230 may have a second thermal expansion coefficient of less than or equal to the first thermal expansion coefficient, the lower structure 230 may expand relatively less than the upper structure 130, and the semiconductor package 100 may not be upwardly bent. In example embodiments, the lower structure 230 may include a dummy core 240, a first lower insulating layer 250, a second lower insulating layer 252, a third lower insulating layer 254, a fourth lower insulating layer 256, a lower solder resist 258, a conductive pattern 260 and a lower plug 270. The lower structure 230 may correspond to a package substrate of the semiconductor package 100.

The first lower insulating layer 250 may be arranged on a lower surface of the upper insulating layer 150 to partially surround the semiconductor chip 110. The first lower insulating layer 250 may have a lower surface higher than the lower surface of the semiconductor chip 110. The first lower insulating layer 250 may have a hole configured to expose the lower contact 176. The first lower insulating layer 250 may include a material substantially the same as the material of the upper insulating layer 150.

The dummy core 240 may be arranged on a lower surface of the first lower insulating layer 250 to surround the semiconductor chip 110. The dummy core 240 may suppress warpage of the semiconductor package 100. The dummy core 240 may be positioned at side surfaces of the semiconductor chip 110, and the dummy core 240 may suppress warpage of an edge portion of the semiconductor package 100. The dummy core 240 may have a hole in fluidic communication with the hole of the first lower insulating layer 250. In example embodiments, the dummy core 240 may include an insulating material.

The second lower insulating layer 252 may be arranged on the lower surface of the first lower insulating layer 250 to cover the lower surface of the semiconductor chip 110 and the lower surface of the dummy core 240. The second lower insulating layer 252 may have a hole in fluidic communication with the hole of the dummy core 240. Further, the second lower insulating layer 252 may have a hole configured to expose the conductive bumps 120. In example embodiments, the second lower insulating layer 252 may include a material substantially the same as the material of the first lower insulating layer 250.

The lower plug 270 may be formed in the holes of the first lower insulating layer 250, the dummy core 240, and the second lower insulating layer 252, and the lower plug 270 may make electrical contact with the lower contact 176 of the upper plug 170. In example embodiments, the lower plug 270 may include a material substantially the same as the material of the upper plug 170. In example embodiments, the upper structure 130 may not include the upper plug 170, and the lower structure 230 may not include the lower plug 270.

The third lower insulating layer 254 may be arranged on a lower surface of the second lower insulating layer 252. The third lower insulating layer 254 may have a hole in fluidic communication with the hole of the second lower insulating layer 252. In example embodiments, the third lower insulating layer 254 may include a material substantially the same as the material of the second lower insulating layer 252.

The fourth lower insulating layer 256 may be arranged on a lower surface of the third lower insulating layer 254. The fourth lower insulating layer 256 may have a hole in fluidic communication with the hole of the third lower insulating layer 254. In example embodiments, the fourth lower insulating layer 256 may include a material substantially the same as the material of the second lower insulating layer 252.

The conductive pattern 260 may be formed in the holes of the second lower insulating layer 252, the third insulating layer 254, and the fourth lower insulating layer 256. The conductive pattern 260 may be electrically connected with the semiconductor chip 110 through the conductive bumps 120. The conductive pattern 260 may include a first pattern 262, a second pattern 264, and a third pattern 266. In example embodiments, the conductive pattern 260 may include copper.

The first pattern 262 may be formed in the hole of the second lower insulating layer 252. The first pattern 262 may include a vertical portion and a horizontal portion. The vertical portion of the first pattern 262 may be formed in the hole of the second lower insulating layer 252. The vertical portion of the first pattern 262 may make electrical contact with the conductive bump 120. The horizontal portion of the first pattern 262 may extend from a lower end of the vertical portion of the first pattern 262 along the lower surface of the second lower insulating layer 252. In example embodiments, the first pattern 262 may be formed together with the lower plug 270, and the horizontal portion of the first pattern 262 may have a thickness substantially the same as a thickness of the lower plug 270.

The second pattern 264 may be formed in the hole of the third lower insulating layer 254. The second pattern 264 may include a vertical portion and a horizontal portion. The vertical portion of the second pattern 264 may be formed in the hole of the third lower insulating layer 254. The vertical portion of the second pattern 264 may make electrical contact with the horizontal portion of the first pattern 262. The horizontal portion of the second pattern 264 may extend from a lower end of the vertical portion of the second pattern 264 along the lower surface of the third lower insulating layer 254. The vertical portion of the second pattern 264 may make electrical contact with the lower plug 270.

The third pattern 266 may be formed in the hole of the fourth lower insulating layer 256. The third pattern 266 may include a vertical portion and a horizontal portion. The vertical portion of the third pattern 266 may be formed in the hole of the fourth lower insulating layer 256. The vertical portion of the third pattern 266 may make electrical contact with the horizontal portion of the second pattern 264. The horizontal portion of the third pattern 266 may extend from a lower end of the vertical portion of the third pattern 266 along the lower surface of the fourth lower insulating layer 256.

The lower solder resist 258 may be arranged on the lower surface of the fourth lower insulating layer 256 to expose the horizontal portion of the third pattern 266. External terminals 280, e.g., solder balls, may be mounted on the horizontal portion of the third pattern 266 and exposed through the lower solder resist 258.

As mentioned above, the second thermal expansion coefficient of the lower structure 230 may be no more than the first thermal expansion coefficient of the upper structure 130. The second thermal expansion coefficient may be an average of the thermal expansion coefficients of the first lower insulating layer 250, the second lower insulating layer 252, the third lower insulating layer 254, the fourth lower insulating layer 256, and the lower solder resist 258.

Further, a thickness of a conductive portion in the lower structure 230 may be a sum of thicknesses of the horizontal portions in the first pattern 262, the second pattern 264, and the third pattern 266. The thickness of the conductive portion in the upper structure 130 may be greater than or equal to the thickness of the conductive portion in the lower structure 230, and warpage of the semiconductor package 100 may be suppressed. The conductive portions in the semiconductor package 100 may suppress warpage, and the conductive portion of the upper structure 130 being thicker than the conductive portion of the lower structure 230 may suppress the semiconductor package 100 from being upwardly bent.

Figure 2:
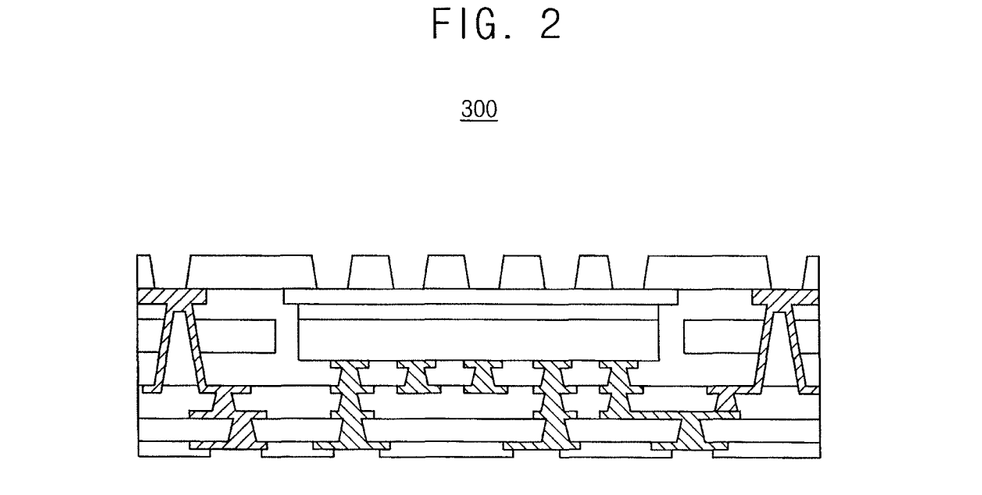
FIG. 2 illustrates a cross-sectional view of a semiconductor package in accordance with a Comparative Example.

FIG. 2 illustrates a cross-sectional view of a semiconductor package in accordance with a Comparative Example.

Referring to FIG. 2, a semiconductor package 300 of a Comparative Example may include elements substantially the same as the elements of the semiconductor package 100 in FIG. 1 except for not including the main contact, the upper contact, and the upper solder resist.

As shown in Table 1, the elements of the semiconductor package 300 may have thermal expansion coefficients and thicknesses different from the thermal expansion coefficients and the thicknesses of the elements in the semiconductor package 100.

TABLE 1

|  |  | Semiconductor package in FIG. 1 | | Semiconductor package in FIG. 2 | |
| --- | --- | --- | --- | --- | --- |
|  |  | Thermal expansion coefficient (ppm) | Thickness (μm) | Thermal expansion coefficient (ppm) | Thickness (μm) |
| Upper structure | Upper solder resist | 60 | 10 |  |  |
|  | Upper contact |  | 7 |  |  |
|  | Upper insulating layer | 10 | 25 | 21 | 30 |
|  | Lower contact |  | 18 |  | 23 |
|  | Die attach film | 110 | 20 | 58 | 40 |
|  | Semiconductor chip |  | 80 |  | 50 |
| Lower structure | First lower insulating layer | 23 | 20 | 12 | 30 |
|  | Dummy core |  | 60 |  | 63 |
|  | Second lower insulating layer | 23 | 40 | 11 | 30 |
|  | First pattern |  | 7 |  | 8 |
|  | Third lower insulating layer | 23 | 17 | 10 | 20 |
|  | Second pattern |  | 7 |  | 8 |
|  | Fourth lower insulating layer | 10 | 25 | 10 | 20 |
|  | Third pattern |  |  | 7 | 10 |
|  | Lower solder resist | 60 | 10 | 60 | 5 |

As shown in Table 1, the first thermal expansion coefficient of the upper structure in the semiconductor package 100 may be about 60 ppm (i.e., an average of the upper solder resist, the upper insulating layer, and the die attach film). The second thermal expansion coefficient of the lower structure in the semiconductor package 100 may be about 27.8 ppm (i.e., an average of the first lower insulating layer, the second lower insulating layer, the third lower insulating layer, the fourth lower insulating layer, and the lower solder resist), and a difference between the first thermal expansion coefficient and the second thermal expansion coefficient may be about 32.2 ppm. Further, the thickness of the conductive portion in the upper structure of the semiconductor package 100 may be about 25 μm. The thickness of the conductive portion in the lower structure of the semiconductor package 100 may be about 21 μm, and the conductive portion of the upper structure may be thicker than the conductive portion of the lower structure.

With reference to the Comparative Example of FIG. 2, a first thermal expansion coefficient of the upper structure in the semiconductor package 300 may be about 39.5 ppm (i.e., an average of the upper insulating layer and the die attach film). A second thermal expansion coefficient of the lower structure in the semiconductor package 300 may be about 20.6 ppm (i.e., an average of the first lower insulating layer, the second lower insulating layer, the third lower insulating layer, the fourth lower insulating layer, and the lower solder resist), and a difference between the first thermal expansion coefficient and the second thermal expansion coefficient may be about 18.9 ppm. Further, the thickness of the conductive portion in the upper structure of the semiconductor package 300 may be about 23 μm. The thickness of the conductive portion in the lower structure of the semiconductor package 300 may be about 26 μm, and the conductive portion of the upper structure may be thinner than the conductive portion of the lower structure.

Figure 3:
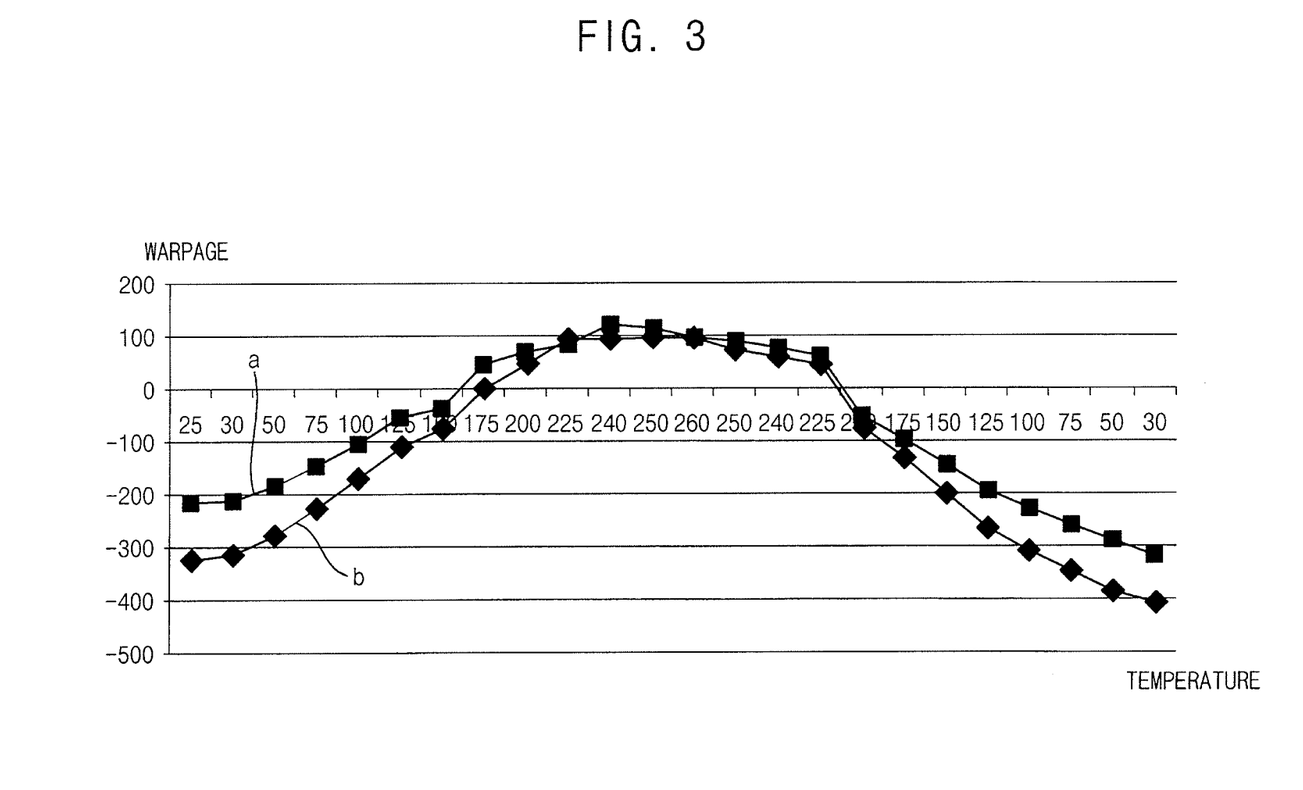
FIGS. 3 and 4 illustrate graphs showing warpage of the semiconductor package in FIG. 1 and the semiconductor package in FIG. 2.
Figure 4:
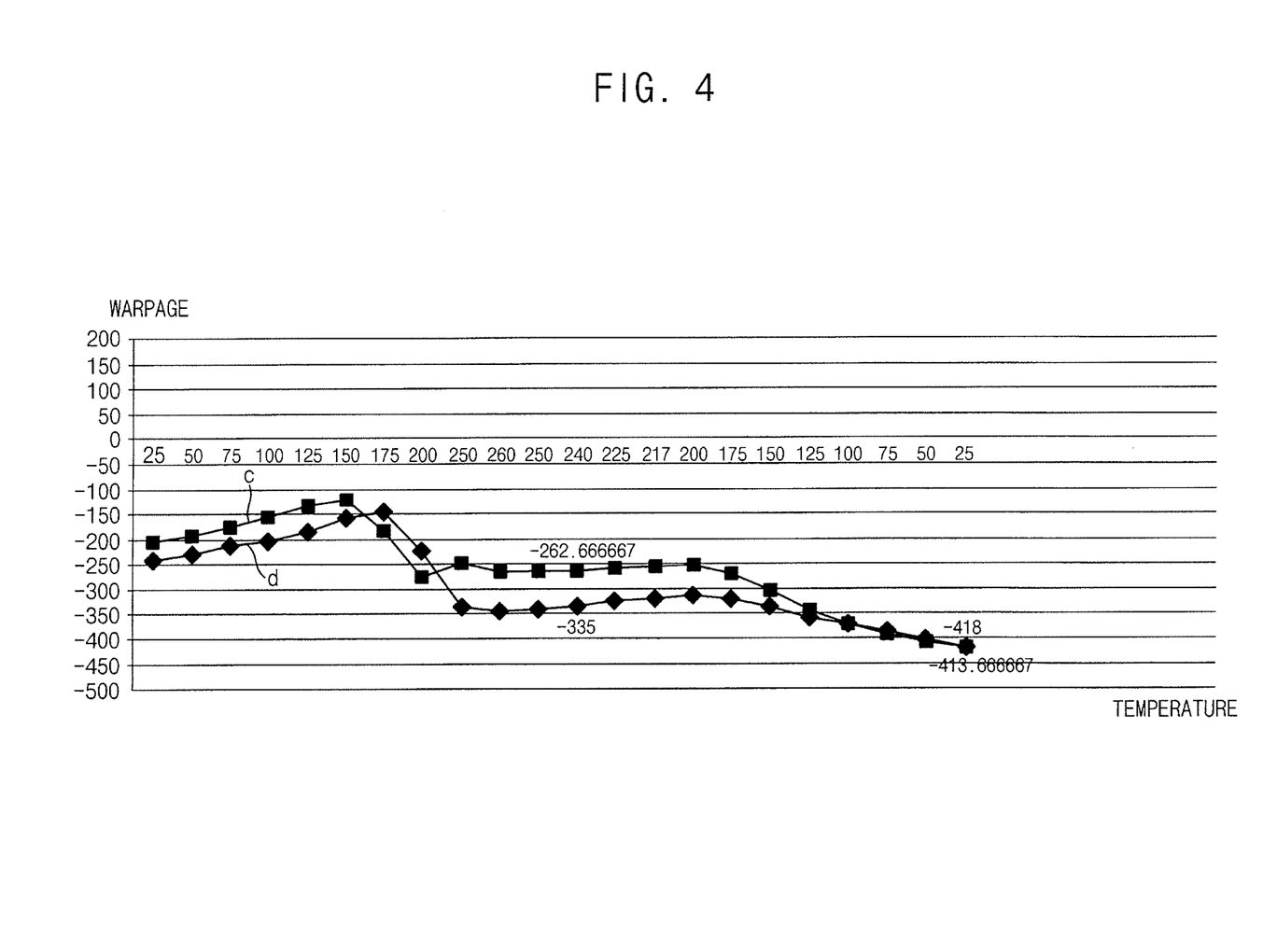

FIGS. 3 and 4 illustrate graphs showing warpage of the semiconductor package in FIG. 1 and the semiconductor package in FIG. 2. In FIGS. 3 and 4, a vertical axis may represent a temperature and a horizontal axis may represent warpage (μm) of the semiconductor packages. Further, in FIG. 3, a curved line a may represent a first thermal expansion coefficient and a curved line b may represent a second thermal expansion coefficient in the semiconductor package in FIG. 1. In FIG. 4, a curved line c may represent a first thermal expansion coefficient and a curved line d may represent a second thermal expansion coefficient in the semiconductor package in FIG. 2.

As shown in FIGS. 3 and 4, the first thermal expansion coefficient may be higher than the second thermal expansion coefficient and the thickness of the conductive portion in the upper structure may be thicker than the thickness of the conductive portion in the lower structure, and warpage of the semiconductor packages 100 and 300 may be suppressed. As shown in FIG. 4, the semiconductor package 300 having a difference of about 18.9 between the first thermal expansion coefficient and the second thermal expansion coefficient may be upwardly bent. In example embodiments, the semiconductor package 100 having a difference of about 32.2 between the first thermal expansion coefficient and the second thermal expansion coefficient may not be upwardly bent. Warpage of the semiconductor package may be effectively suppressed when a difference between the first thermal expansion coefficient and the second thermal expansion coefficient is greater than or equal to about 30 ppm.

FIGS. 5 to 8 illustrate graphs showing warpage in accordance with thickness variations of conductive portions of the semiconductor package in FIG. 1 at a temperature of about 25° C., and FIGS. 9 to 12 illustrate graphs showing warpage in accordance with thickness variations of conductive portions of the semiconductor package in FIG. 1 at a temperature of about 240° C. In FIGS. 5 to 12, a horizontal axis may represent a thickness of the conductive portions and a vertical axis may represent warpage of the semiconductor package.

Figure 5:
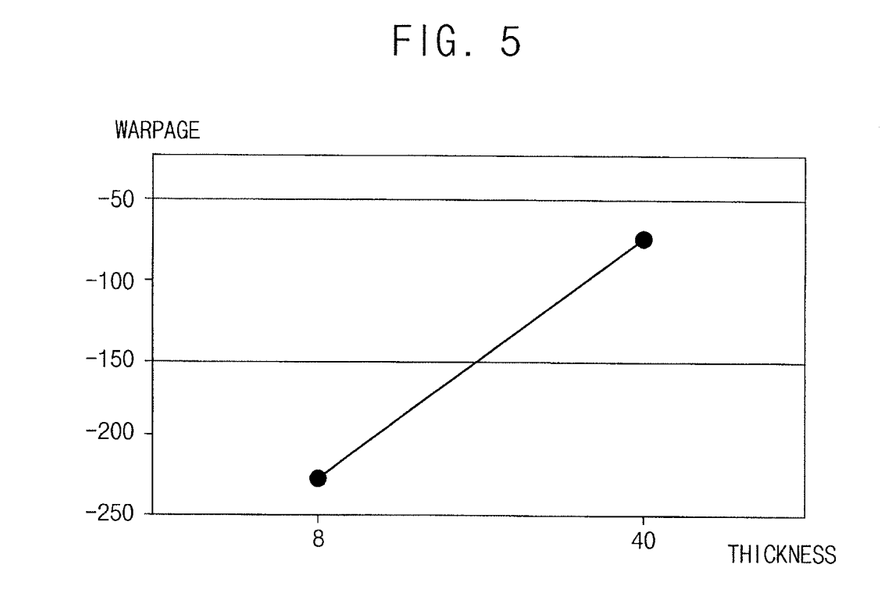
FIGS. 5 to 8 illustrate graphs showing warpage in accordance with thickness variations of conductive portions of the semiconductor package in FIG. 1 at a temperature of about 25° C.
Figure 6:
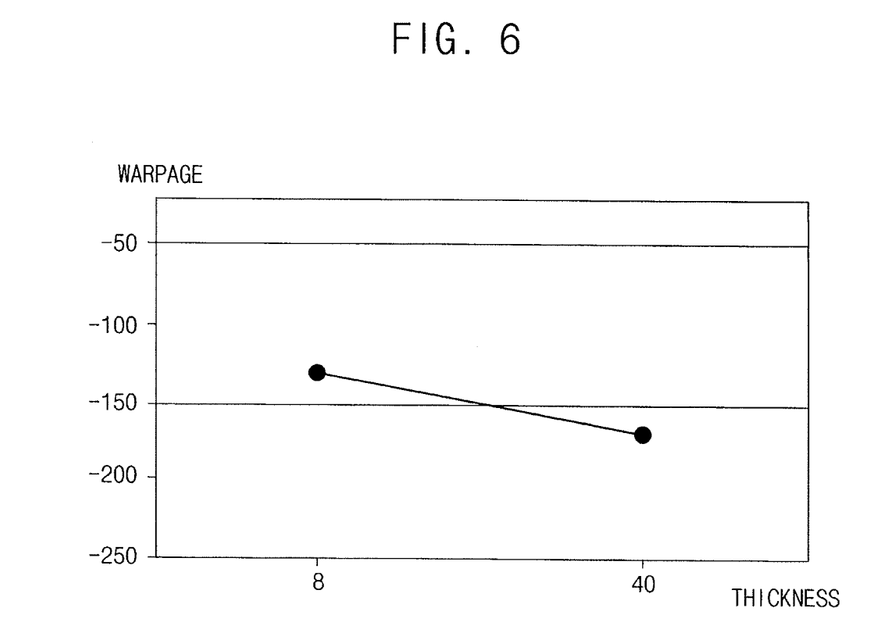
Figure 7:
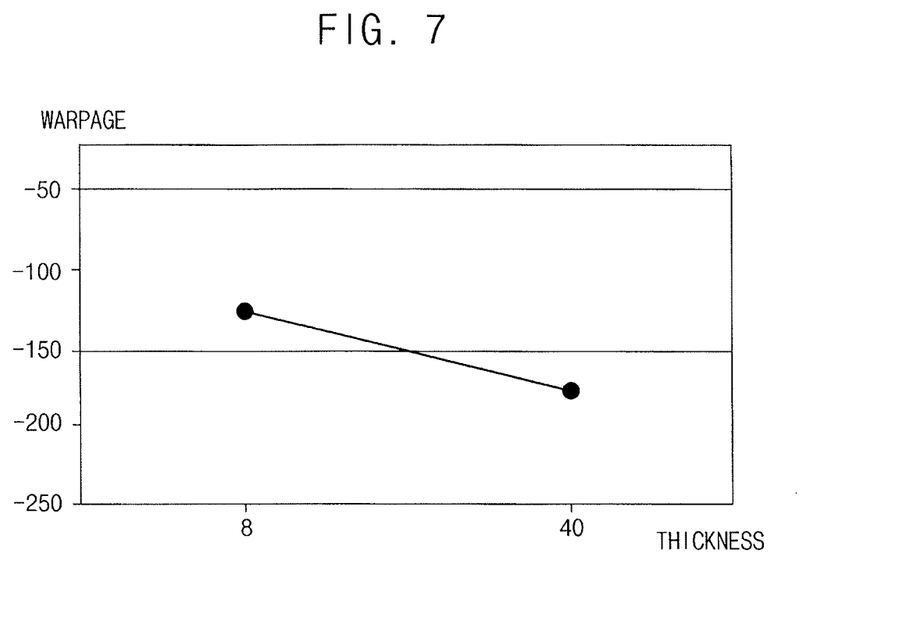
Figure 8:
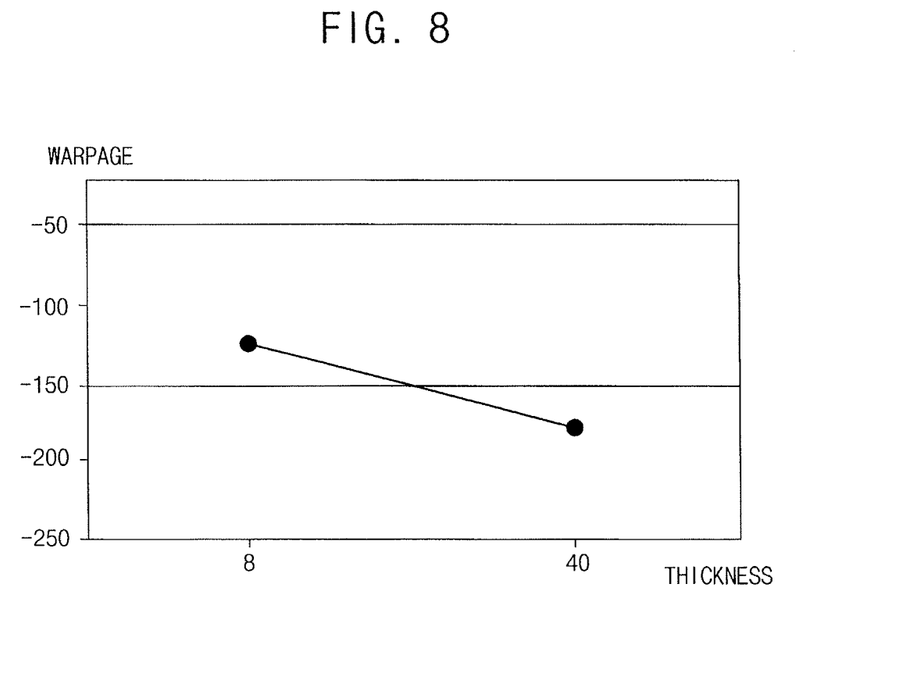
Figure 9:
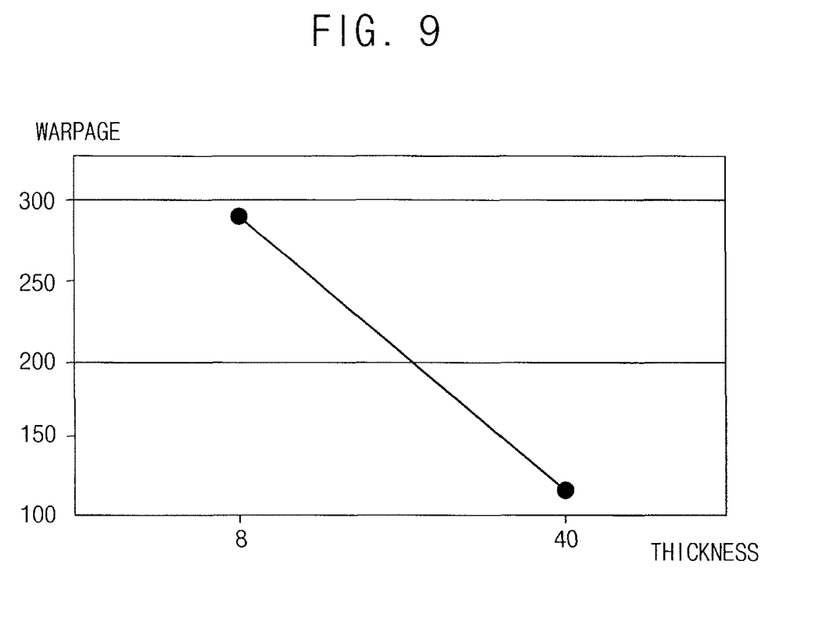
FIGS. 9 to 12 illustrate graphs showing warpage in accordance with thickness variations of conductive portions of the semiconductor package in FIG. 1 at a temperature of about 240° C.
Figure 10:
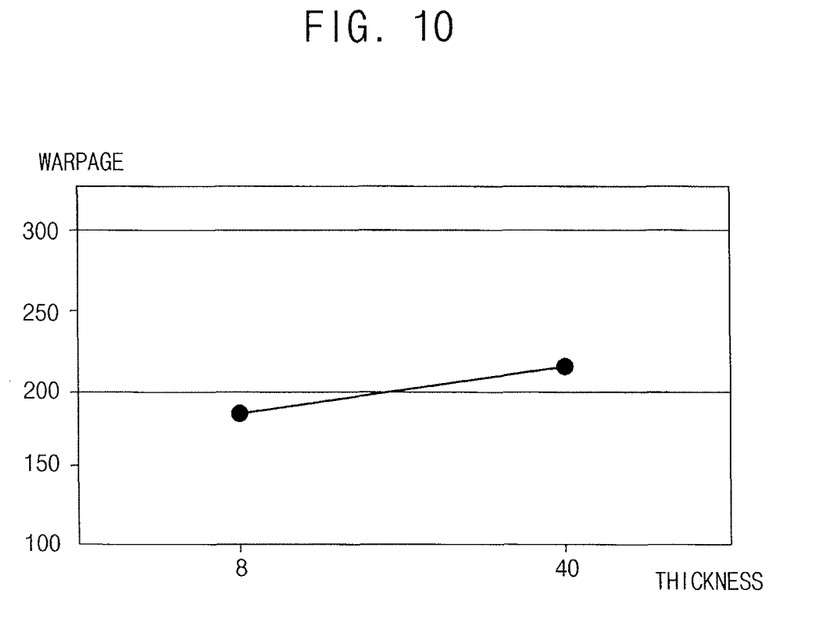
Figure 11:
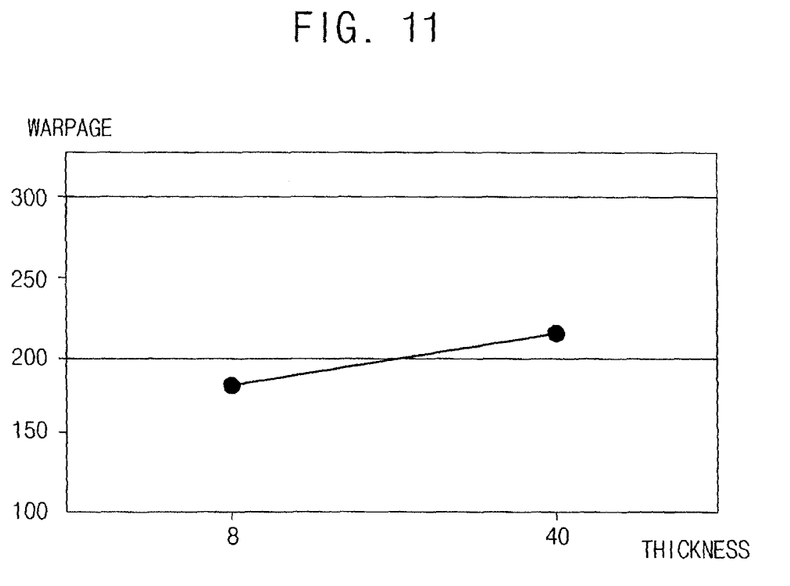
Figure 12:
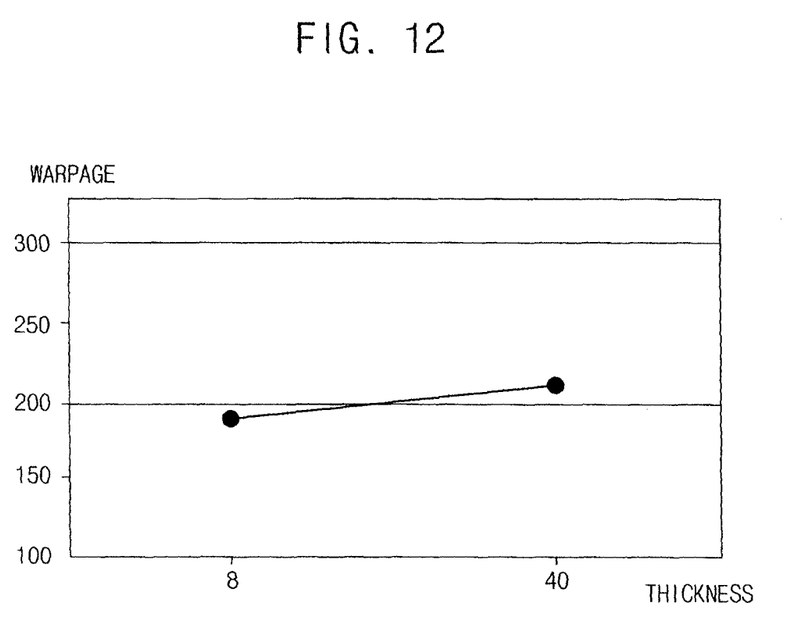

As shown in FIGS. 6 to 8, the thickness of the lower structure may be changed from about 8 μm to about 40 μm at a temperature of about 25° C., and the semiconductor package may be slightly bent. As shown in FIG. 5, the thickness of the upper structure may be changed from about 8 μm to about 40 μm at a temperature of about 25° C., and the semiconductor package may be greatly bent. As shown in FIGS. 10 to 12, the thickness of the lower structure may be changed from about 8 μm to about 40 μm at a temperature of about 240° C., and the semiconductor package may be slightly bent. As shown in FIG. 9, the thickness of the upper structure may be changed from about 8 μm to about 40 μm at a temperature of about 240° C., and the semiconductor package may be greatly bent. Warpage of the semiconductor package may be dependent upon the thickness of the conductive portion in the upper structure.

Figure 13:
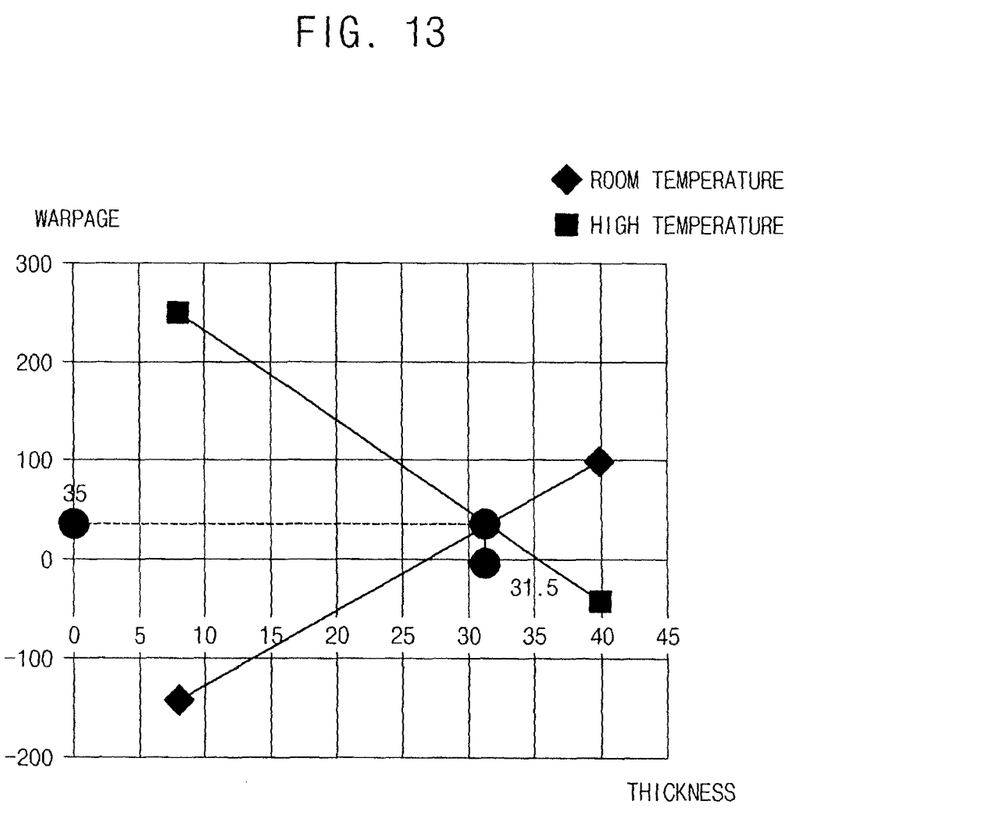
FIG. 13 illustrates a graph showing warpage in accordance with thickness variations of a conductive portion of an upper structure in the semiconductor package of FIG. 1.

FIG. 13 illustrates a graph showing warpage in accordance with thickness variations of a conductive portion of an upper structure in the semiconductor package of FIG. 1. In FIG. 13, a horizontal axis may represent a thickness of the conductive portion in the upper structure and a vertical axis may represent warpage of the semiconductor package. Further, a straight line a may represent warpage of the semiconductor package at a temperature of about 25° C., and a straight line b may represent warpage of the semiconductor package at a temperature of about 240° C.

As shown in FIG. 13, the thickness of the conductive portion in the upper structure may be about 31.5 μm, and warpage of the semiconductor package may be about 36 μm at a temperature of about 25° C. and about 35.6 μm at a temperature of about 240° C. For example, the thickness of the conductive portion in the upper structure may be about 35 μm, and warpage of the semiconductor package may be about zero.

Figure 14:
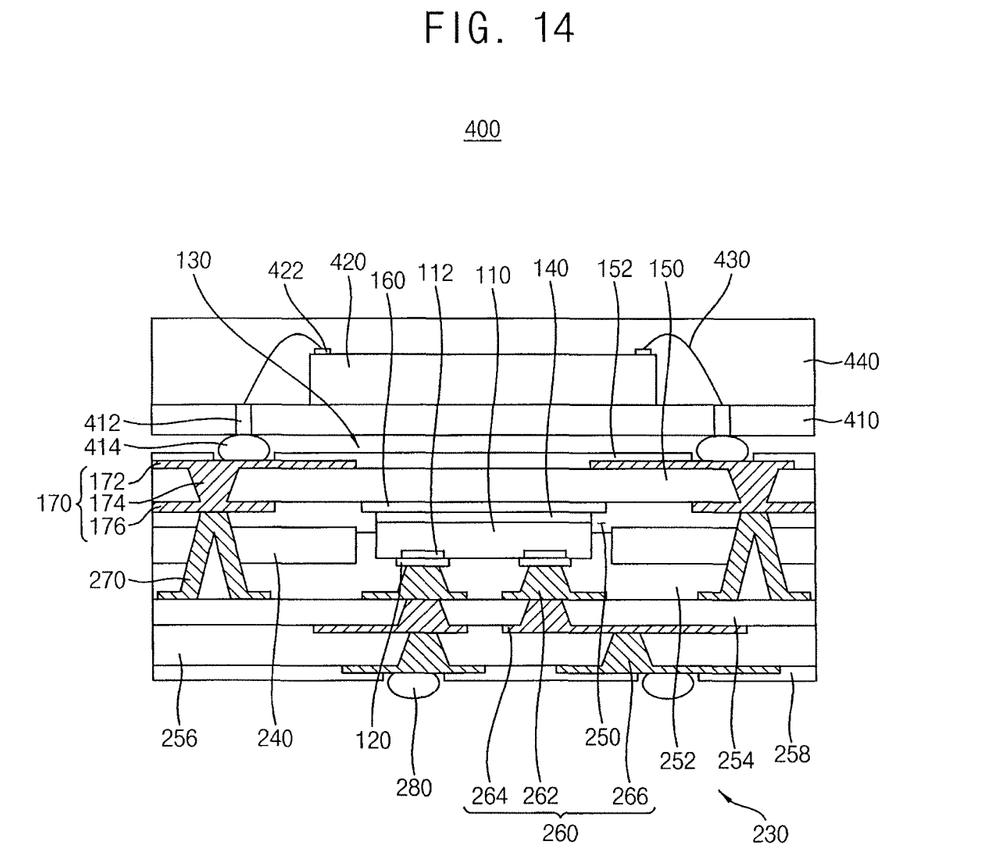
FIG. 14 illustrates a cross-sectional view of a semiconductor package in accordance with example embodiments.

FIG. 14 illustrates a cross-sectional view of a semiconductor package in accordance with example embodiments.

A semiconductor package 400 of this example embodiment may include elements substantially the same as the elements of the semiconductor package 100 in FIG. 1 except for further including a memory package. The same reference numerals may refer to the same elements and any further illustrations with respect to the same element may be omitted herein for brevity.

Referring to FIG. 14, the memory package may include a package substrate 410, a semiconductor chip 420, a conductive wire 430, and a molding member 440.

The package substrate 410 may be arranged over the semiconductor package 100, and the package substrate 410 may have a lower surface facing the upper solder resist 152 of the upper structure 130. A conductive pattern 412 may be vertically formed in the package substrate 410. The conductive pattern 412 may have an upper end exposed through an upper surface of the package substrate 410. The conductive pattern 412 may have a lower end exposed through the lower surface of the package substrate 410. The lower end of the conductive pattern 412 may be electrically connected to the upper contact 174 of the upper plug 170 through a conductive bump 414.

The semiconductor chip 420 may be arranged on the upper surface of the package substrate 410. The semiconductor chip 420 may have bonding pads 422. The bonding pads 422 may be arranged on an edge portion of the upper surface of the semiconductor chip 420. In example embodiments, the semiconductor chip 420 may include a memory chip.

The conductive wire 430 may be electrically connected between the bonding pads 422 of the semiconductor chip 420 and the upper end of the conductive pattern 412. The molding member 440 may be formed on the package substrate 410 to cover the semiconductor chip 420.

In example embodiments, the memory package may include a package substrate, a memory chip and a conductive wire. The package substrate may be arranged on the upper structure. The package substrate may be electrically connected with the upper structure. The memory chip may be arranged on the package substrate. The conductive wire may be electrically connected between the memory chip and the package substrate.

Figure 15:
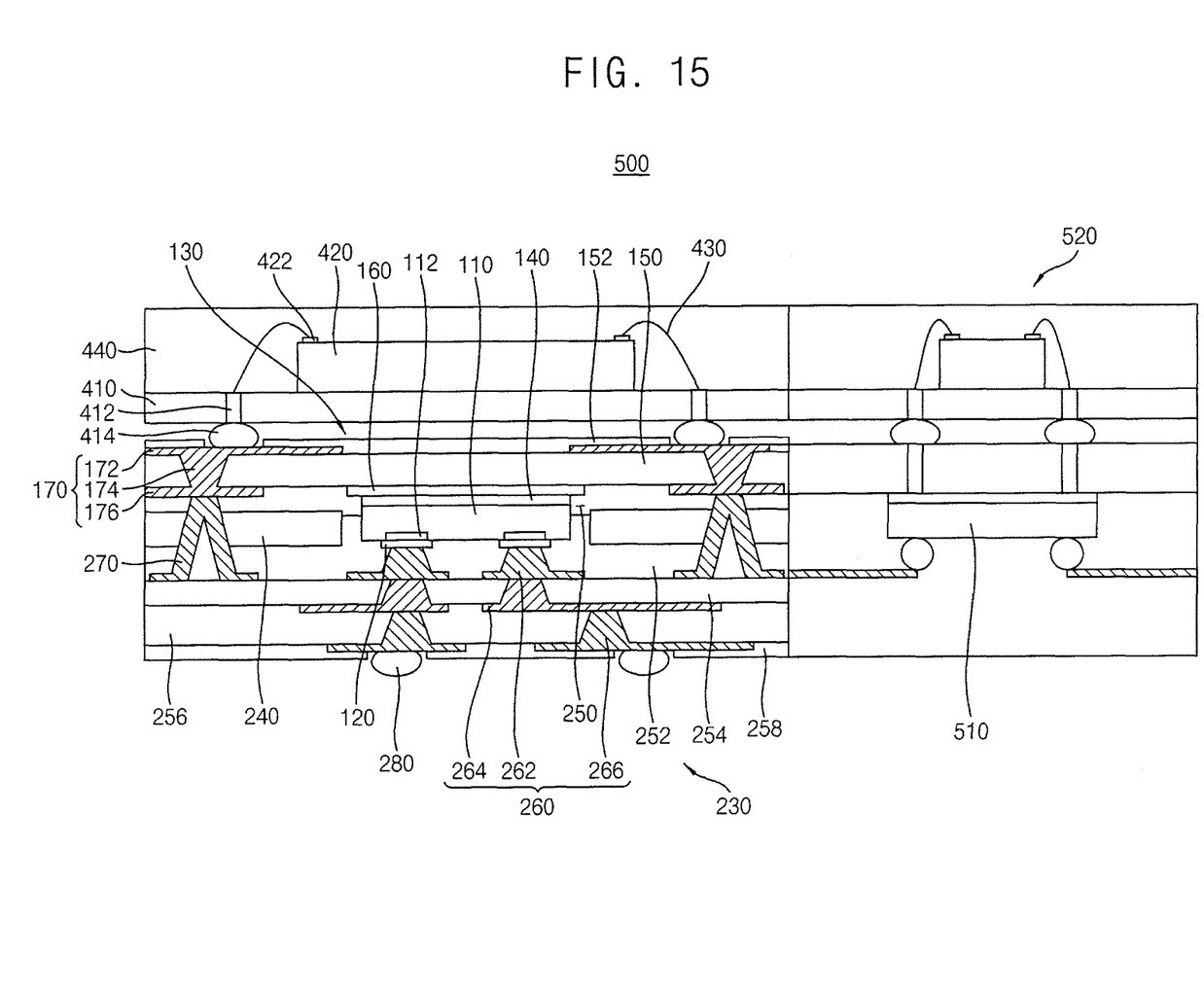
FIG. 15 illustrates a cross-sectional view of a semiconductor package in accordance with example embodiments.

FIG. 15 illustrates a cross-sectional view of a semiconductor package in accordance with example embodiments.

A semiconductor package 500 of this example embodiment may include elements substantially the same as the elements of the semiconductor package 300 in FIG. 14 except for further including a power management integrated circuit (PMIC) chip. The PMIC may be configured to manage power supplied to the semiconductor chip. The same reference numerals may refer to the same elements and any further illustrations with respect to the same element may be omitted herein for brevity.

Referring to FIG. 15, the PMIC chip 510 may be arranged at a side surface of the logic chip 110. The PMIC chip 510 may control a power applied to the logic chip 110. A second semiconductor package 520 may be stacked on the PMIC chip 510. The second semiconductor package 520 may have a structure substantially the same as the structure of the memory package. Any further illustrations with respect to the second semiconductor package 520 may be omitted herein for brevity.

By way of summation and review, a difference between thermal expansion coefficients of a package substrate and a semiconductor chip may be so large that the semiconductor package may be bent. For example, a thermal expansion coefficient of an upper structure over the semiconductor chip may be lower than a thermal expansion coefficient of a lower structure under the semiconductor chip, and the semiconductor package may be upwardly bent.

According to example embodiments, the first thermal expansion coefficient of the upper structure may be greater than or equal to the second thermal expansion coefficient of the lower structure, the upper structure may expand relatively more than the lower structure, and the semiconductor package may not be upwardly bent.

Example embodiments provide a semiconductor package that may be capable of suppressing warpage of the semiconductor package.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a semiconductor chip;
an upper structure over the semiconductor chip, the upper structure having a first thermal expansion coefficient; and
a lower structure under the semiconductor chip, the lower structure having a second thermal expansion coefficient of less than or equal to the first thermal expansion coefficient, the lower structure including a lower insulating layer under the semiconductor chip and the upper structure, the second thermal expansion coefficient being a thermal expansion coefficient of the lower insulating layer, wherein
the upper structure includes:
a die attach film on an upper surface of the semiconductor chip,
a reinforcing plate attached to the die attach film,
an upper insulating layer on the reinforcing plate,
an upper plug through a hole in the upper insulating layer, the upper plug filling the hole in the upper insulating layer, and
an upper solder resist on the upper insulating layer and that partially exposes the upper plug, and
the first thermal expansion coefficient is an average of thermal expansion coefficients of the die attach film, the upper insulating layer, and the upper solder resist.

2. The semiconductor package as claimed in claim 1, wherein the semiconductor chip has a thickness of greater than or equal to a thickness of the die attach film.

3. The semiconductor package as claimed in claim 1, wherein the lower structure includes a conductive pattern in the lower insulating layer and electrically connected to the semiconductor chip, wherein the lower insulating layer is on a lower surface of the upper insulating layer to partially surround the semiconductor chip.

4. The semiconductor package as claimed in claim 3, wherein the lower structure further includes a lower solder resist on a lower surface of the lower insulating layer and that partially exposes the conductive pattern, and the second thermal expansion coefficient is an average of thermal expansion coefficients of the lower insulating layer and the lower solder resist.

5. The semiconductor package as claimed in claim 3, wherein the lower structure further includes a dummy core in the lower insulating layer and that surrounds the semiconductor chip.

6. The semiconductor package as claimed in claim 3, wherein the lower structure further includes a lower plug in the lower insulating layer adjacent to the upper structure and electrically connected to the conductive pattern.

7. The semiconductor package as claimed in claim 1, wherein the semiconductor chip includes a logic chip.

8. The semiconductor package as claimed in claim 1, further comprising a memory package stacked on the upper structure.

9. A semiconductor package, comprising:
a semiconductor chip;
a die attach film on an upper surface of the semiconductor chip;
a reinforcing plate attached to the die attach film;
an upper insulating layer on the reinforcing plate;
a lower insulating layer under the semiconductor chip; and
a conductive pattern in the lower insulating layer and electrically connected to the semiconductor chip,
an average of thermal expansion coefficients of the die attach film and the upper insulating layer being greater than or equal to a thermal expansion coefficient of the lower insulating layer, and the reinforcing plate having a thickness greater than a thickness of the conductive pattern.

10. The semiconductor package as claimed in claim 9, wherein a difference between the average of the thermal expansion coefficients of the die attach film and the upper insulating layer, and the thermal expansion coefficient of the lower insulating layer is greater than or equal to about 30 ppm.

11. The semiconductor package as claimed in claim 9, further comprising a dummy core in the lower insulating layer and that surrounds the semiconductor chip.

12. The semiconductor package as claimed in claim 11, further comprising a plug through the upper insulating layer, the dummy core, and the lower insulating layer and electrically connected to the conductive pattern.

13. A semiconductor package, comprising:
a semiconductor chip;
an upper structure over the semiconductor chip, the upper structure having a first thermal expansion coefficient and including:
an upper insulating layer on an upper surface of the semiconductor chip, and
an upper plug through the upper insulating layer; and
a lower structure under the semiconductor chip, the lower structure having a second thermal expansion coefficient, a difference between the first thermal expansion coefficient and the second thermal expansion coefficient being greater than or equal to about 30 ppm,
wherein the upper plug includes:
a main contact in a hole of the upper insulating layer;
an upper contact extending from an upper end of the main contact and on an upper surface of the upper insulating layer; and
a lower contact extending from a lower end of the main contact and on a lower surface of the upper insulating layer.

14. The semiconductor package as claimed in claim 13, wherein the upper structure includes:
a die attach film on an upper surface of the semiconductor chip;
a reinforcing plate attached to the die attach film; and
an upper solder resist on the upper insulating layer and that partially exposes the upper plug,
wherein the upper insulating layer is on the reinforcing plate.

15. The semiconductor package as claimed in claim 14, wherein the lower structure includes:
a first lower insulating layer;
a second lower insulating layer;
a third lower insulating layer;
a fourth lower insulating layer; and
a lower solder resist on a lower surface of the lower insulating layer and that partially exposes the conductive pattern.

16. The semiconductor package as claimed in claim 15, wherein:
the first thermal expansion coefficient is an average of thermal expansions of the upper solder resist, the upper insulating layer, and the die attach film; and
the second thermal expansion coefficient is an average of thermal expansions of the first lower insulating layer, the second lower insulating layer, the third lower insulating layer, the fourth lower insulating layer, and the lower solder resist.

* * * * *